(12) United States Patent
Fautz et al.

(10) Patent No.: US 9,097,779 B2
(45) Date of Patent: Aug. 4, 2015

(54) MAGNETIC FIELD INSENSITIVE CEST IMAGING

(75) Inventors: Hans-Peter Fautz, Forchheim (DE);
Dominik Paul, Bubenreuth (DE)

(73) Assignee: Siemens Aktiengesellschaft, Munich (DE)

(*) Notice: Subject to any disclaimer, the term of this patent is extended or adjusted under 35 U.S.C. 154(b) by 605 days.

(21) Appl. No.: 13/541,239

(22) Filed: Jul. 3, 2012

(65) Prior Publication Data
US 2013/0009640 A1    Jan. 10, 2013

(30) Foreign Application Priority Data
Jul. 5, 2011    (DE) .......................... 10 2011 078 680

(51) Int. Cl.
G01V 3/00 (2006.01)
G01R 33/56 (2006.01)
G01R 33/485 (2006.01)
G01R 33/561 (2006.01)
G01R 33/565 (2006.01)

(52) U.S. Cl.
CPC .......... G01R 33/5605 (2013.01); G01R 33/485 (2013.01); G01R 33/5601 (2013.01); G01R 33/5612 (2013.01); G01R 33/5659 (2013.01); G01R 33/56563 (2013.01)

(58) Field of Classification Search
CPC ..................................................... G01R 33/485
USPC ................................................. 324/307, 309
See application file for complete search history.

(56) References Cited

U.S. PATENT DOCUMENTS

| | | | |
|---|---|---|---|
| 6,023,634 A | 2/2000 | Hanawa et al. | |
| 8,278,925 B2 * | 10/2012 | Sun et al. | 324/308 |
| 8,536,866 B2 * | 9/2013 | Van Zijl et al. | 324/309 |
| 8,659,295 B2 * | 2/2014 | Jellus et al. | 324/309 |
| 8,686,727 B2 * | 4/2014 | Reddy et al. | 324/307 |
| 8,742,755 B2 * | 6/2014 | Vinogradov et al. | 324/309 |
| 2010/0286502 A1 | 11/2010 | Van Zijl et al. | |

OTHER PUBLICATIONS

Sun et al., "Correction for Artifacts Induced by B0 and B1 Field Inhomogeneities in pH-Sensitive Chemical Exchange Saturation Transfer (CEST) Imaging," Magn. Res. Med., vol. 58 (2007), pp. 1207-1215.
Liu et al., "High-throughput screening of chemical exchange saturation transfer MR contrast agents," Contrast Media Mol. Imaging, vol. 5 (2010), pp. 162-170.
Sun, P.Z., "Simultaneous determination of labile proton concentration and exchange rate utilizing optimal RF power: Radio frequency power (RFP) dependence of chemical exchange saturation transfer (CEST) MRI," J. Magn. Reson., vol. 202 (2010), pp. 155-161.
Murase et al., "Numerical solutions to the time-dependent Bloch equations revisited," Magn. Reson. Imag., vol. 29 (2011), pp. 126-131.

\* cited by examiner

*Primary Examiner* — Louis Arana
(74) *Attorney, Agent, or Firm* — Schiff Hardin LLP

(57) ABSTRACT

In a method for accelerated CEST imaging in magnetic resonance tomography, RF pulses for the saturation of the protons of the substance to be shown are emitted by several transmission coils, and shape of these RF pulses is calculated using an optimization method so that a weighted sum is minimized, the sum exhibiting at least two of the following norms: the norm of the magnetization of free water protons in each point in space, the norm of the deviation of the magnetization of the bound protons from an inverted magnetization in each point in space and the norm of the magnetization of protons with an inverted shift relative to the predefined frequency shift in each point in space. The shape of the RF pulses for subsequent excitation of the free water protons also can be calculated for the optimization method.

17 Claims, 4 Drawing Sheets

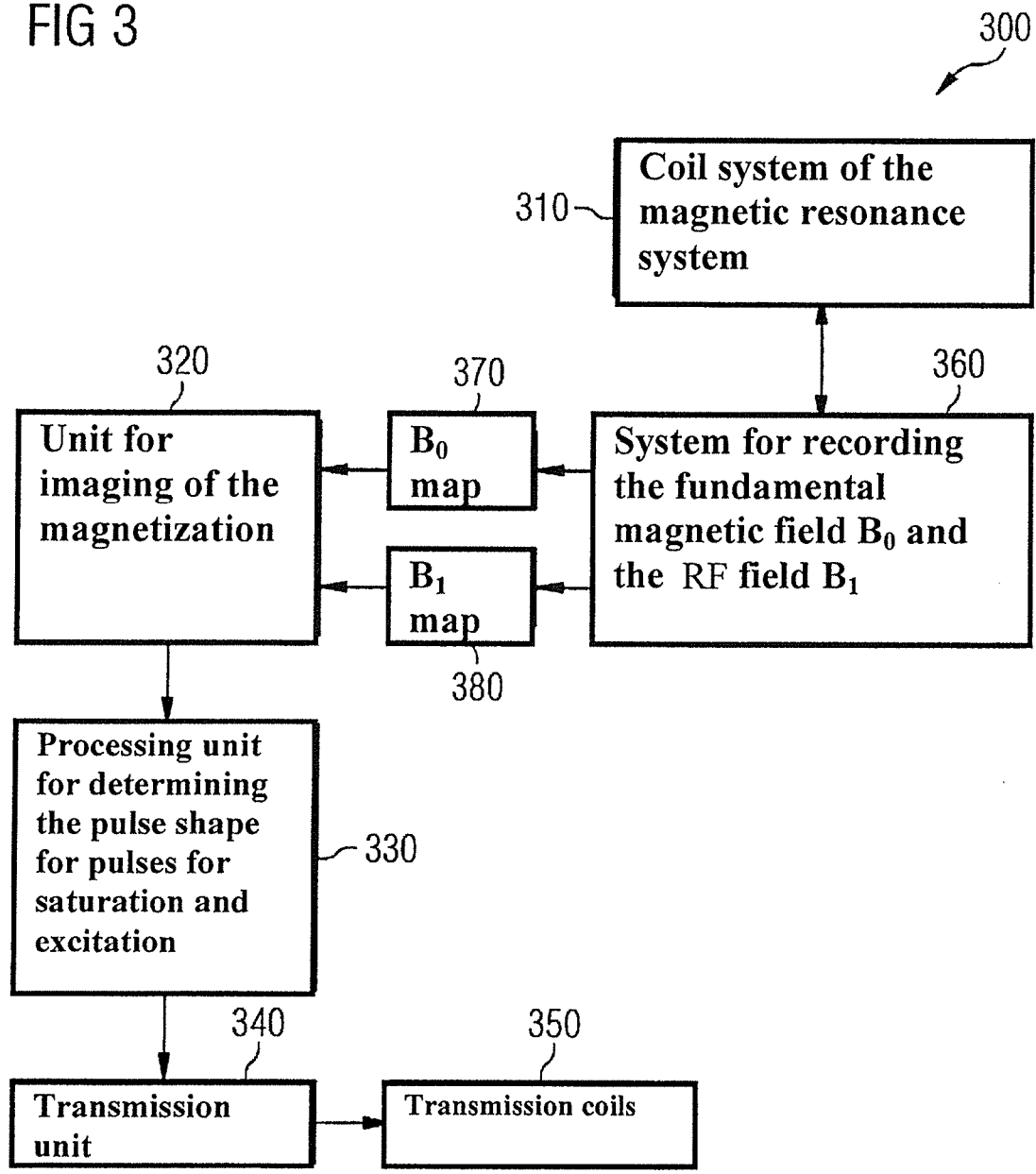

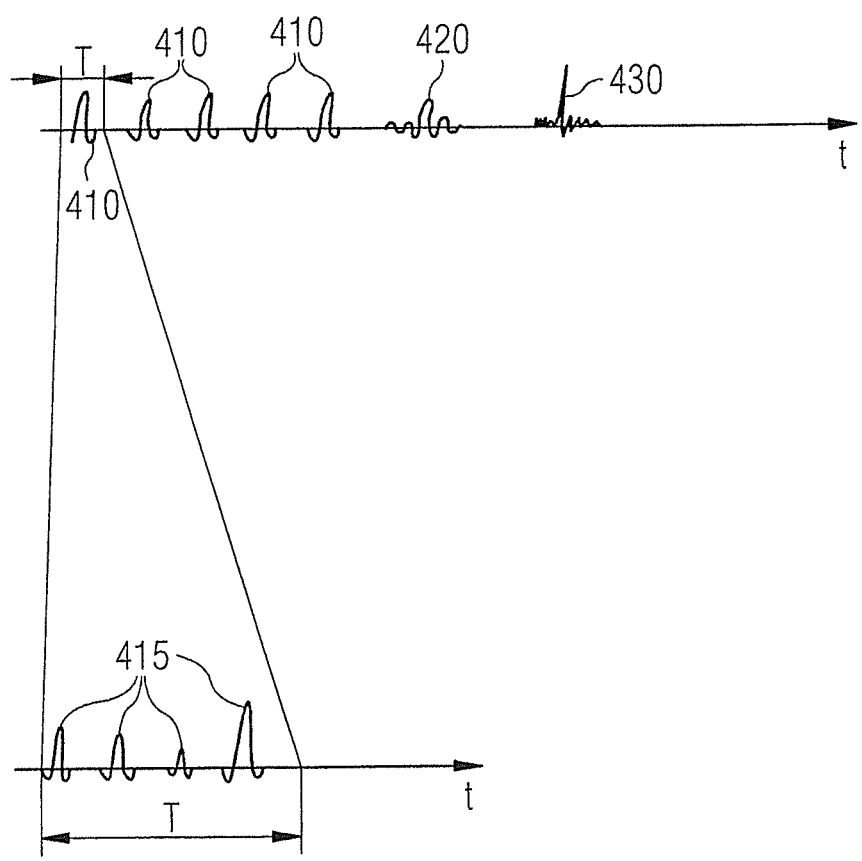

MAGNETIC FIELD INSENSITIVE CEST IMAGING

BACKGROUND OF THE INVENTION

1. Field of the Invention

The present invention relates to a method and a corresponding device for reducing the sensitivity of chemical exchange saturation transfer (CEST) imaging in magnetic resonance tomography systems due to inhomogeneities of the fundamental magnetic field and of the RF field.

2. Description of the Prior Art

Along with the use of clinical magnetic resonance tomography systems (MRT systems) for morphological imaging, in which contrasts between tissues are generated on the basis of the magnetic properties of proton free water molecules, in recent years it has increasingly become possible through the development of new methods to also determine physiological parameters using clinical tomography systems.

In 1990, the use of the chemical exchange of protons, which are bound to certain molecules, with free water molecules, was proposed in order to obtain information about the chemical environment of these certain molecules and about these molecules themselves. In the process, protons of certain low concentrated molecules can be transferred via this chemical carryover to free water molecules. As a result of this specific information of these certain molecules can be represented in three dimensional high resolution on the basis of the water signal. This method is referred to as the CEST method (chemical exchange saturation transfer). The CEST method takes advantage in particular of the chemical shift, the saturation, and the chemical exchange of protons:

In NMR spectroscopy, chemical shift means the distance of a resonance line of the sample (i.e. for example the resonance or Larmor frequency of certain protons in a certain molecule) from the resonance line of a randomly selected standard, which is assigned the chemical shift 0. This chemical shift, which is independent of the magnetic field strength of the employed spectrometer, is specified in ppm. The cause of the chemical shift is the magnetic susceptibility of the electrons that surround the respective core of the atom. This leads to a partial shielding of the external magnetic field through the electrons. If the atom is part of a molecule, the electron density, and with it the shielding effect, is influenced by the neighboring atom. Therefore, the spectral lines of the protons in the specified molecules are shifted from the spectral line of water protons by a certain frequency. This shift usually lies in the region between 1 ppm and 50 ppm. Therefore, for example by means of a selective excitation through a narrow-band RF field, only the selected protons of the specified molecule can be specifically excited, but not those of the water.

Saturation in NMR imaging means the excitation of certain nuclei by RF pulses of corresponding frequency (saturation pulse) in such a way that a maximum number of spins of the respective nuclear-spin system are in an excited state. For example, this can happen by means of a sufficiently long irradiation of the stimulating high frequency on a certain spin system. As a result, the occupations of the state's approach a balance, in which the number of spins in an excited state equals the number of those in the ground state. This disappearance of the occupation number difference is referred to as saturation and produces the result, upon a subsequent high frequency excitation that NMR signals can no longer be detected.

Chemical exchange (CE) refers to all processes in which an isolated nuclear spin is exchanged between two chemical environments, as a result of which its NMR parameters (e.g. chemical shift, relaxation times etc.) are altered. This chemical exchange takes place, for example, through the exchange of protons between free water molecules and the protons of substances dissolved therein. The exchange rates of such protons lie in the magnitude of 10 Hz and 1000 Hz. Corresponding to these exchange rates a bonding time (exchange time) of 1 ms to 100 ms can be defined. The speed of the exchange is influenced in particular by the pH value of the chemical environment as well as by its temperature.

CEST can resolve different signals of protons of various molecules by using these effects in magnetic resonance tomography. For this purpose a specified proton signal (of protons of the molecule to be examined, thus the CEST substance) is selectively excited in such a way that its magnetization saturates. As a consequence of the free chemical exchange of the saturated protons of this molecule with the surrounding water protons, the nuclear resonance signal is weakened by the protons of the immediate surrounding water molecules. MRT images that are recorded (acquired) with and without corresponding saturation pulses therefore show the spatial distribution of the corresponding CEST substances. These CEST substances are often compounds that cannot be shown with the conventional methods of NMR because, for example, their associated T2 times are too small or the concentration of the substances is so low that a generated resonance signal is too weak for imaging. For CEST imaging, the speed of the chemical exchange should lie within a specified range so that it takes place quickly enough in order to saturate the water signal, but still it should take place slowly enough so that a sufficient difference of the chemical shift occurs between the exchanged protons and the water protons. The size of the CEST effect therefore depends both on the exchange rate as well as on the number of exchangeable protons. Since the rate of the chemical exchange depends on the pH value, with CEST a pH weighted imaging can be carried out.

With the CEST method, the distribution of the saturated free water protons generated by the chemical exchange is shown. These water protons generate practically no resonance signal (weakening) in contrast to unsaturated water protons when excited with RF pulses at the frequency of the water protons. In particular a pictorial representation of the distribution of the CEST substances can be obtained by the comparison of two images. In the case of the first image, the weakening of the signal of the water protons is measured, as described above, while in the case of the second image a signal distribution is recorded without prior saturation. In the process either the resonance frequency of the free water protons can be selected as the excitation frequency or it is excited with a frequency that is shifted by the negative value of the chemical shift with respect to the water frequency.

The contrast mechanism based on CEST basically has the potential to show vital functions, such as, for example, metabolic processes or of measuring the pH value of tissue in-vivo. The contrast amplification in the process can reach values of $10^2$ to $10^6$ relative to the natural occurrence of the interesting molecules.

However, due to the very narrow-band saturation excitation the CEST imaging is extremely sensitive to spatial variation of the fundamental magnetic field ($B_0$ field), since a spatial deviation of the magnetic field has a direct effect as a deviation of the respective resonance frequency.

Another disadvantage is due to the fact that the quantification of the saturation effect presupposes a spatially constant RF field ($B_1$ field), so that the tilting of the spin of the protons to be excited (saturation flip angle) by the relevant volume is constant.

According to the prior art, therefore, the following measures are taken in order to reduce potential disturbances of the image quality of the CEST imaging through uneven distribution of the magnetic fields.

Improvement of the spatial homogeneity through optimized $B_0$ shim: for the shimming either special sheets of iron are placed in the bore of the magnetic resonance tomographs or specially formed additional coils are actuated in the MR tomographs in such a way that the field inhomogeneities of the fundamental magnetic field are extensively suppressed.

Recording of a saturation spectrum: In the process a series of measurements are performed with different frequencies of the saturation pulses. The measurement is then extracted from the saturation spectrum, in which case the saturation frequency precisely matches the value which results from the sum of the chemical resonance shift and the shift by the spatial local variation of the $B_0$ field. The optimum saturation frequency for a specific point in space can be determined from an additionally recorded $B_0$ field map (i.e. a mapping which shows the spatial field distribution of the fundamental magnetic field, also referred to as $B_0$ field map).

The saturation spectrum (i.e. the frequency distribution of the saturation pulse) can also overlap spectrally with the spectrum of the excitation. As a result, the possibility of a miscalculation of the CEST effect arises. This can be avoided if the saturation spectrum is symmetrically recorded by the proton excitation spectrum, i.e. with a frequency shift which is shifted by the negative value of the chemical shift with respect to the water frequency. As a result, the effects cancel each other (subtract) to null, these effects arising on the basis of direct saturation of the hydrogen protons during the CEST preparation if one determines the difference of positive and negative saturation spectrum.

However, the necessity of an image of the saturation spectrum makes the previous CEST method very inefficient, since among the points in space, only a few (frequency) points are evaluated that contribute to signal to noise obtainment.

SUMMARY OF THE INVENTION

An object of the present invention is to provide an improved and accelerated CEST imaging even in the case of spatial variations of the $B_0$ and $B_1$ field. In addition, through the present invention high flip angles should be achieved within the exchange times of the affected protons without in the process running into system driven performance limits or exceeding permissible specific absorption rates (SAR) in the body tissue.

In accordance with the invention this object is achieved by a method for magnetic field insensitive CEST imaging in magnetic resonance tomography and by a magnetic resonance system for the creation of magnetic field insensitive CEST images.

Within the scope of the present invention a method is provided for magnetic field insensitive CEST imaging in magnetic resonance tomography in which a number of transmission coils for the detection of MR signals from bound protons of a substance each emit at least one RF pulse for saturation and at least one RF pulse for excitation. The method comprises the following steps.

(1.) Imaging of magnetization through RF pulses generated by the transmission coils in each point in space as a function of a spatial distribution of a fundamental magnetic field, and of a spatial distribution of the RF field generated from the transmission coils, and of the time course of a field gradient during the excitation, and of the time envelope function of an RF pulse, and of a predefined frequency shift.

(2.) Determination of the shape of the at least one RF pulse for saturation for each of the transmission coils via a solution of a minimization problem in which case a weighted sum is minimized, which exhibits at least two of the following three norms: the norm of the magnetization of free water protons in each point in space, the norm of the deviation of the magnetization of the bound protons from an inverted magnetization in each point in space, and the norm of the magnetization of protons with a shift inverted with respect to the predefined frequency shift in each point in space.

As used herein "norm" means the mathematical definition of the term, in which case the individual magnetization values are correspondingly exponentiated. For example, for an exponentiation by the factor 1, the sum of magnitudes norm is calculated as the sum of the magnitudes of the individual values. Correspondingly, for an exponentiation by the factor 2 the Euclidean norm arises, which is calculated via the square root of the sum of the respectively squared individual values.

The predefined frequency shift is in the process preferably the chemical shift of the protons of the substance with respect to the resonance frequency of the free water protons.

Both the spatial distribution of the fundamental magnetic field as well as the spatial distribution of the RF field generated by the transmission coils can preferably be determined via a picture of a $B_0$ map or a $B_1$ map.

In one preferred embodiment the saturation of the magnetization (i.e. of the MR signals) can occur in the case of two frequencies, wherein the first frequency is shifted with respect to the resonance frequency of free water protons by the predefined frequency shift and the second frequency is shifted with respect to the resonance frequency of free water protons against the predefined frequency shift.

(3.) In addition, the shape of the at least one RF pulse for excitation can be determined for each of the transmission coils via a solution of a minimization problem, in which case a weighted sum is minimized, said sum exhibiting at least two of the following three norms: the norm of the deviation of the generated magnetization from an ideal magnetization of the free water protons in each point in space, the norm for the magnetization of the bound protons in each point in space, and the norm for the magnetization of protons whose resonance frequency is shifted by the negative value with respect to the predefined frequency shift.

In a further embodiment, both the RF pulses for saturation as well as the RF pulses for excitation can each be divided into a sequence of several sub-pulses, wherein each of the sub-pulses is applied at a defined time so that in the case of the determination of the shape of the RF pulse a designated frequency can be assumed.

In addition, the saturation behavior can be calculated for the chemical shift for both frequency shifts, the predefined frequency shift and a shift inverted to the predefined frequency shift and then is used for correction of a CEST effect.

The saturation and excitation pulses to be transmitted will therefore first be determined by a computing process. In the process the distribution of the fundamental magnetic field, ($B_0$ field) and the distributions of the RF field ($B_1$ field) generated by the individual transmission coils are taken as a basis, which for example can be determined by a previously performed recording of $B_1$ and $B_0$ maps. With this a generated magnetization can be imaged in each point in space, as a function of the $B_1$ and $B_0$ maps, of the time gradient course during the excitation, of the time course of the envelope function of the exciting RF pulse and of a predefined frequency shift, wherein the predefined frequency shift arises from the chemical shift. The calculation of the magnetization can, for example occur with the use of the non-linear Bloch equations or by means of a linear approximation.

The computing process for determination of optimum saturation pulses is formulated as a minimization problem and can, for example be solved with the aid of iterative approximation methods. In the process, three averaged values of the magnetization must be taken into consideration:

(1.) For free water protons (whose distribution of the local Larmor frequency arises from the $B_0$ map) the generated magnetization in each point in space should be as small as possible. Since this generated magnetization arises via an averaging of many individual magnetizations, in this connection the norm of the magnetization should be minimal.

(2.) For the bound protons, i.e. the protons of the CEST substance (whose Larmor frequency is shifted with a corresponding chemical shift Delta relative to the free water protons) the magnetization should be inverted. Therefore the norm of the deviation of the generated magnetization from an inverted magnetization (with due regard of the $B_0$ map) should be minimal.

(3.) Likewise the saturation of protons should be optimized whose frequency is shifted with respect to the resonance frequency of free water protons by Delta (i.e. whose resonance frequency is shifted by the negative value of the chemical shift with respect to the water frequency).

In the process, the iterative approximation method calculates the pulses in such a way that either the sum of all three described norms is minimized or the sum of two norms selected from the three is minimized in consideration of the field distribution.

Analogous to the determination of the optimum saturation pulses, an iterative method for the determination of optimum excitation pulses is also formulated as a minimization problem. However, here the free water protons should be optimally excited so that the norm of the deviation of the generated magnetization from an ideal magnetization should be formed. Furthermore, the norms for the magnetization of the bound protons and for the magnetization of protons whose resonance frequency is shifted by the negative value of the chemical shift with respect to the water frequency are formed.

Here as well, the iterative approximation method is used to calculate pulses in such a way that either the sum of all three described norms is minimized or the sum of two norms selected from the three described norms is minimized.

For recording of the data relevant for the imaging, the spins of the bound protons, i.e. of the protons of the substance to be examined are saturated with the aid of the optimized pulses via several transmission coils within the tomography. In the process the individual transmission coils each emit simultaneously or at staggered intervals one or more RF saturation pulses, wherein the pulses have been calculated previously by the corresponding optimization in accordance with the pulse design problem. Subsequently, one or more optimized excitation pulses are generated via the several transmission coils in order to excite the water protons. In the process the individual transmission coils each emit simultaneously or at staggered intervals an RF excitation pulse or a series of individual RF excitation sub-pulses, wherein the pulses have been previously calculated by the corresponding optimization in accordance with the pulse design problem.

For the image recording preferably a saturation of the protons is carried out for both directions of the frequency shift by the value of the chemical shift relative to the resonance frequency of the free water protons.

The saturation behavior is calculated from the obtained measurement data for the chemical shifts in both directions relative to the resonance frequency of the free water protons, and, if applicable used for the correction of the CEST effect.

The steps for the imaging of the magnetization and the computing process for the determination of optimum saturation or excitation pulses can alternatively also be determined by the following approach, which describes a further embodiment of the present invention. To this purpose one assumes that an RF pulse (for excitation or for saturation) can be divided into a sequence of n sub-pulses $P_1, P_2, \ldots P_n$, wherein the individual sub-pulses are applied at the respective times $t_1, t_2, \ldots t_n$. The phasing of the individual sub-pulses, said phasing being determined via the respective pulse shape and the time of the application, can be determined in such a way that it maps the time phase development of the magnetization of the respective protons (which are spatially varied on the basis of the local variations of the Larmor frequency). With this it is possible to take spatial variations of the Larmor frequency into consideration with the specification of a target phase and the determination of an optimal pulse design is reduced to a magnetization with unshifted Larmor frequency. Through suitable selection of the pulse spacing an excitation and non-excitation can be simultaneously taken into consideration at different frequencies.

The present invention also encompasses a magnetic resonance system for the creation of magnetic field insensitive CEST images. This magnetic resonance system has multiple transmission coils for the detection of MR signals of bound protons of a substance, wherein both RF pulses for saturation as well as also RF pulses for excitation can be emitted via the transmission coils. In addition, the magnetic resonance system has a unit that can determine a magnetization generated through RF pulses of the transmission coils in each point in space as a function of a spatial distribution of a fundamental magnetic field, of the spatial distribution of the RF field generated by the transmission coils, of the time course of a field gradient during excitation, of the time envelope function of the RF pulses and of a predefined frequency shift. The system also has a processing unit that can determine the shape of the RF pulses for saturation for each of the transmission coils via a solution of a minimization problem, in which case a weighted sum is minimized which exhibits at least two of the following three norms: the norm of the magnetization of free water protons in each point in space, the norm of the deviation of the magnetization of the bound protons from an inverted magnetization in each point in space and the norm of the magnetization of protons with an inverted shift with respect to the predefined frequency shift in each point in space.

The processing unit can additionally be configured to determine the shape of the RF pulses for excitation for each of the transmission coils via a solution of a minimization problem in which case a weighted sum is minimized which exhibits at least two of the following three norms: the norm of the deviation of the generated magnetization from an ideal magnetization of the free water protons in each point in space, the norm for the magnetization of the bound protons in each point in space and the norm for the magnetization of protons whose resonance frequency is shifted by the negative value with respect to the predefined frequency shift.

Preferably the magnetic resonance system has a system for the recording of the spatial distribution of the fundamental magnetic field and of the spatial distribution of the RF field generated by the transmission coils as an image of a $B_0$ map and of a $B_1$ map.

In a further embodiment the RF pulses for saturation and for excitation determined by the processing unit can be divided into a sequence of several sub-pulses, wherein each of the sub-pulses is applied at a defined time, so that the processing unit can proceed from a defined frequency in the determination of the shape of the RF pulses.

Preferably the RF pulses for saturation and for excitation of the MR signals are generated by a suitable transmission unit which generates MR signals with a shape determined by the processing unit and forwards the MR signals to the multiple transmission coils.

The frequency of the RF pulses for excitation of the MR signals preferably lies at the frequency of free water protons, while the frequency for saturation of the MR signals preferably lies at a frequency which is shifted by a chemical shift of the CEST substance with respect to the resonance frequency of free water protons.

Alternatively, the RF pulses for saturation can also be generated by the transmission unit at two frequencies, wherein the first frequency is shifted by the chemical shift of the substance with respect to the resonance frequency of free water protons and the second frequency is shifted against the chemical shift of the substance with respect to the resonance frequency of free water protons.

The present invention offers the following advantages.

Defined flip angles of the relevant proton spins can be achieved irrespective of location and local Larmor frequency.

Through the parallel transmission with several transmission coils high flip angles can be achieved within the exchange times of the relevant protons without in the process running into system driven performance limits or exceeding permissible specific absorption rates (SAR) in the body tissue.

Also, through the repetition of saturation pulses prior to the excitation or the division of saturation and excitation pulse into several sub-pulses on the one hand high flip angles are achieved with simultaneous reduction of the required transmission power or of the SAR load.

The saturation pulses are calculated in such a way that they are symmetrical with respect to the chemical shift. I.e. their frequency is shifted by the negative value of the chemical shift with respect to the water frequency. Optionally or additionally an asymmetrical saturation behavior can be simulated and used for correction.

Through the use of the inventive $B_0$ and $B_1$ insensitive saturation pulses the recording of a saturation spectrum becomes superfluous. Therefore it is sufficient to record two points of the spectrum. As a result of this the measuring time for the CEST imaging can be reduced by at least one order of magnitude.

BRIEF DESCRIPTION OF THE DRAWINGS

FIG. 3 schematically illustrates an inventive magnetic resonance system for creating magnetic field insensitive CEST images.

FIG. 4 shows saturation pulses consisting of individual sub-pulses, an excitation pulse and an echo signal.

DESCRIPTION OF THE PREFERRED EMBODIMENTS

Figure 1:
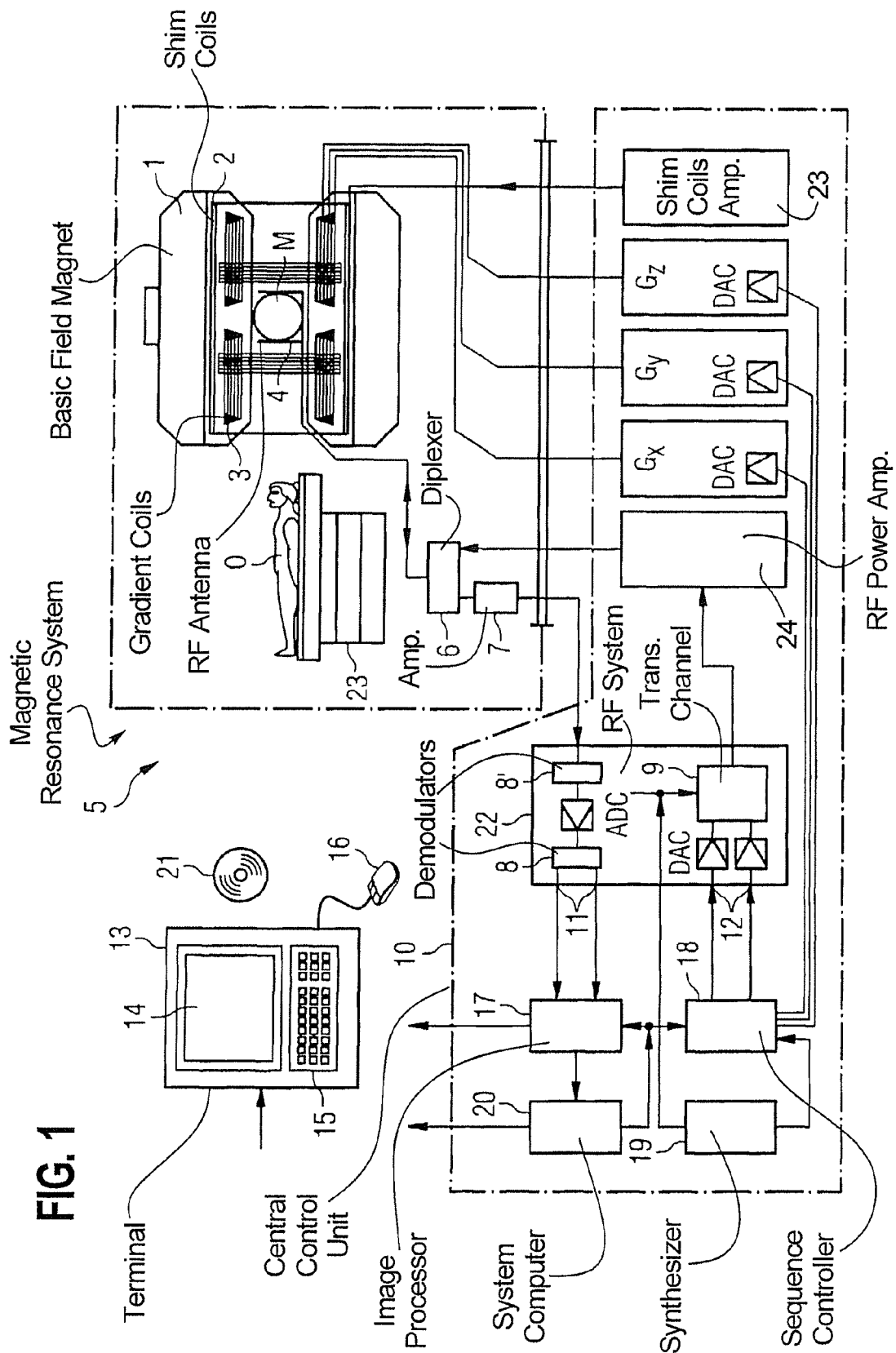
FIG. 1 schematically illustrates an inventive magnetic resonance system.

FIG. 1 is a schematic representation of a magnetic resonance system 5 and a central control unit 10 as can be used both for imaging nuclear resonance tomography and for magnetic resonance spectroscopy. A basic field magnet field 1 generates a temporally constant strong magnetic field $B_0$ for polarization or for alignment of the nuclear spins in a region under investigation of an object O, such as, for example, a part of a human body to be examined, the part being shifted on a table 23 lying in the magnetic resonance system 5. The high homogeneity of the fundamental magnetic field required for nuclear spin resonance tomography is defined in a measurement volume M. For support of the homogeneity requirements and in particular for the elimination of time invariable influences, shims made of ferromagnetic material are mounted at a suitable location. Time variable influences are eliminated by shim coils 2 according to signals from shim coils amplifier 23.

A cylindrical gradient coil system 3 is inserted into the fundamental field magnet 1, composed of three windings. The windings are provided with power by respective amplifiers for the generation of linear (also time modifiable) gradient field in the respective directions of the Cartesian coordinate system. The first winding of the gradient field system 3 generates a gradient Gx in x-direction, the second winding generates a gradient Gy in y-direction and the third winding generates a gradient Gz in z-direction. Each amplifier has a digital-to-analog converter that is controlled by a sequence controller 18 for the generation of gradient pulses at the correct time.

Located within the gradient field system 3 is one (or more) radio-frequency (RF) antenna 4, which convert the high frequency pulses emitted by a radio frequency power amplifier 24 to a magnetic AC field for excitation of the cores and alignment of the nuclear spin of the object O to be examined or of the region to be examined of the object O. Each high frequency antenna 4 has one or more RF transmission coils and one or more RF reception coils in the shape of an annular, preferably linear or matrix-shaped arrangement of component coils. From the RF reception coils of the respective high frequency antenna 4 the AC field proceeding from the processing nuclear spin, usually the nuclear spin echo signals generated from a pulse sequence of one or more high frequency pulses and one or more gradient pulses, is also converted into a voltage (measurement signal) that is fed via an amplifier 7 to a high frequency receive channel 8 of a high frequency system 22. The high frequency system 22 additionally has a transmission channel 9 in which the high frequency pulses are generated for the excitation of the nuclear magnetic resonance. In the process the respective high frequency pulses are digitally represented as a sequence of complex numbers on the basis of a pulse sequence in the sequence controller 18 predefined by the system computer 20. This number sequence is fed as a real part and as an imaginary part via inputs 12 to a digital analog converter in the high frequency system 22 and from the system 22 to a transmission channel 9. In the transmission channel 9 the pulse sequences are modulated to a high frequency carrier signal whose basic frequency corresponds to the resonance frequency of the nuclear spin in the measurement volume.

The switchover from send-receive mode occurs via a diplexer 6. The RF transmission coils of the high frequency antenna(e) 4 irradiate the high frequency pulses for excitation of the nuclear spin to the measurement volume M and resulting echo signals are scanned via the RF reception coil(s). The obtained nuclear resonance signals are phase-sensitively demodulated in the receive channel 8' (first demodulator) of the high frequency system 22 to an intermediate frequency and are digitized in the analog-digital converter (ADC). This signal is also demodulated to the basic frequency. The demodulation to the basic frequency and the separation into real and imaginary parts at outputs 11 takes place, after the digitization, in the digital domain in a second demodulator 8. An image processor 17 reconstructs an MR image from the measurement data obtained in such a way. The administration of the measurement data, the image data and of the control programs occurs via a system computer 20. By means of a specification with control programs the sequence controller 18 controls the generation of the respective desired pulse sequences and the corresponding scanning of the k-space.

The sequence controller 18 controls the switching of the gradients at the correct time, the transmission of the high frequency pulses with defined phase amplitude as well as the reception of the nuclear resonance signals. The time base for the high frequency system 22 and the sequence controller 18 are made available by a synthesizer 19. The selection of corresponding control programs for the generation of an MR image, said control programs being e.g. stored on a DVD 21, as well as the representation of the generated MR image occurs via a terminal 13 comprising a keyboard 15, a mouse 16 and a monitor 14.

Figure 2:
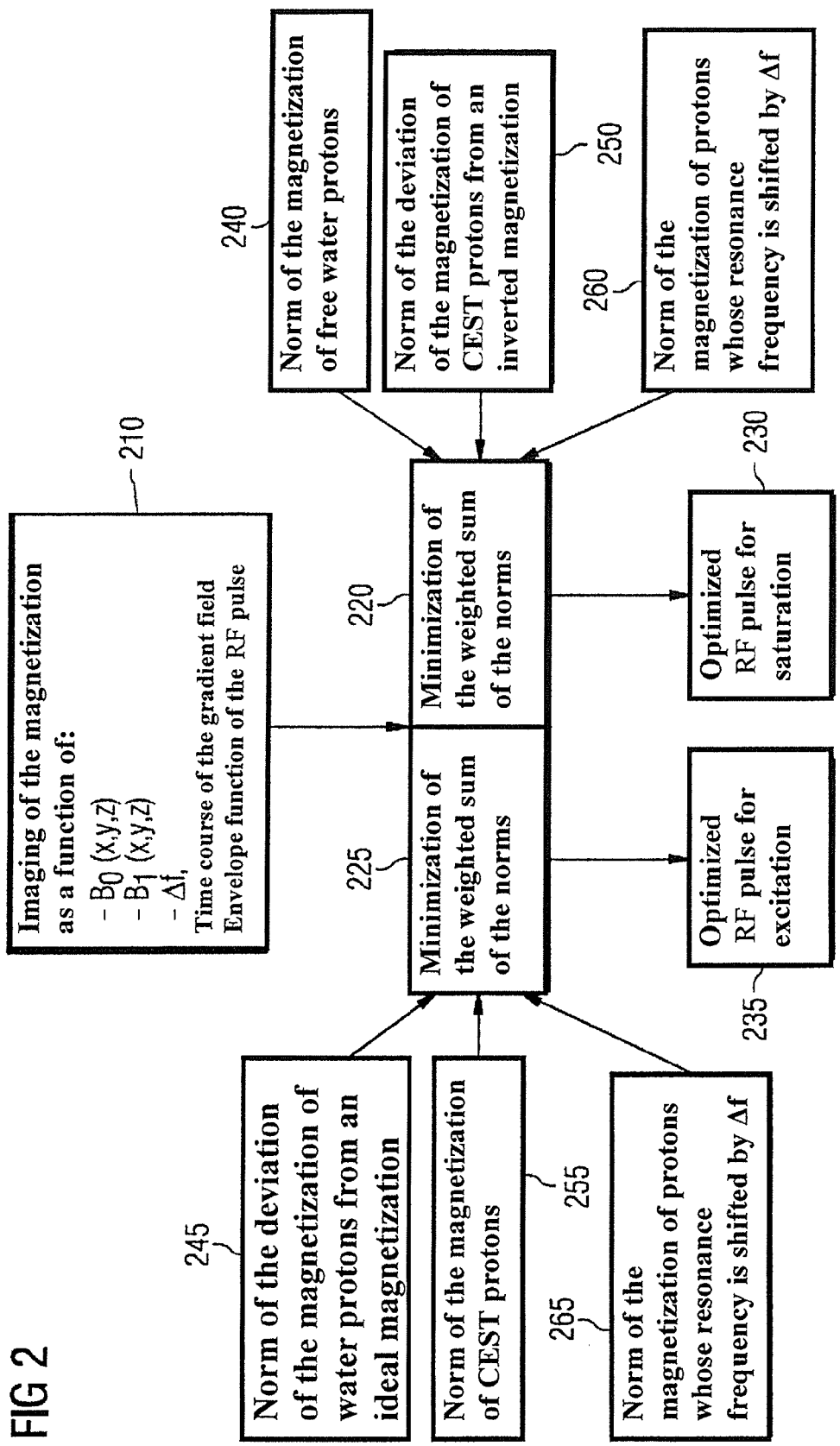
FIG. 2 shows a flow chart of an inventive method for magnetic insensitive CEST imaging in magnetic resonance tomography.

FIG. 2 shows a flow chart for the inventive method for magnetic field insensitive CEST imaging in magnetic resonance tomography. In the process, via the in the case of a plurality of transmission coils at least one RF pulse for saturation of the MR signals of bound protons of a substance (protons of the CEST substance) and at least one RF pulse for excitation of the MR signals of free water protons are emitted in order to obtain MR signals for the representation of the distribution of the CEST substance.

The magnetization through RF pulses generated by the transmission coils is shown in each point in space as a function of a spatial distribution of a fundamental magnetic field, of the spatial distribution of the RF field generated by the transmission coils, of the time course of a field gradient during its excitation, the time envelope function of an RF pulse and of a predefined frequency shift (210).

By calculation, the optimum shape of the at least one RF pulse for saturation of the MR signals is determined for each of the transmission coils. In the process the solution of a minimization problem is determined, in which case a weighted sum is minimized (220), which exhibits at least two of the following three norms: the norm (240) of the magnetization of free water protons in each point in space, the norm (250) of the deviation of the magnetization of the bound protons from an inverted magnetization in each point in space and the norm (260) of the magnetization of protons with an inverted shift with respect to the predefined frequency shift in each point in space.

The optimized RF pulse for saturation can be directly determined from the solution of the minimization problem (230).

In addition the shape of the at least one RF pulse for excitation of the MR signals can also be determined for each of the transmission coils. In the process the solution of minimization problems is determined, in which case a weighted sum is minimized (225), which exhibits at least two of the following three norms: the norm (245) of the deviation of the generated magnetization from an ideal magnetization of the free water protons in each point in space, the norm (255) for the magnetization of the bound protons in each point in space, and the norm (265) for the magnetization of protons whose resonance frequency is shifted by the negative value with respect to the predefined frequency shift.

The optimized RF pulse for excitation can be directly determined from the solution for the minimization problem (235).

FIG. 3 shows a schematic representation of an inventive magnetic resonance system 300 as it can be used for the creation of magnetic field insensitive CEST images. The saturation of the magnetization of the protons (i.e. of the MR signals) of the CEST substance to be examined, as well as the excitation of the magnetization of the free water protons (i.e. of their MR signals) occurs in the process though corresponding RF pulses which are emitted by the transmission coils 350.

The unit 320 shows the magnetization generated by RF pulses emitted by the transmission coils 350 in each point in space as a function of a spatial distribution of a fundamental magnetic field, of the spatial distribution of the RF field generated by the transmission coil 350, of the time course of a field gradient during the excitation, of the time envelope function of the RF pulses and of a predefined frequency shift.

The spatial distribution of the fundamental magnetic field $B_0$ of the coil system 310 is preferably evaluated via the image of a $B_0$ map 370 and the spatial distribution of the RF field $B_1$ generated by the transmission coils 350 is preferably evaluated via the image of a $B_1$ map 380. The recording of the fundamental magnetic field $B_0$ and of the RF field $B_1$ in the form of a $B_0$ map 370 and of a $B_1$ map 380 can in the process occur for example via a system 360 for the recording of these fields that has been provided for this purpose. Alternatively the recording of the fields and the creation of the $B_0$ map 370 and of the $B_1$ map 380 can also be performed by a system which works independently from the magnetic resonance system 300.

The processing unit 330 uses a mathematical optimization method to determine the shape of the RF pulses for saturation of the MR signals of bound protons contained in the CEST substance shown considering the magnetization shown by the unit 320. In the process a solution of a minimization problem is determined for each of the transmission coils, in which case a weighted sum is minimized exhibiting at least two of the three following norms: the norm 240 of the magnetization of free water protons in each point in space, the norm 250 of the deviation of the magnetization of the bound protons from an inverted magnetization in each point in space, and the norm 260 of the magnetization of protons with an inverted shifting with respect to the predefined frequency shifting in each point in space.

Furthermore the processing unit 330 can also be used in consideration of the magnetization shown by the unit 320 for the determination of the shape of RF pulses for excitation of the MR signals for free water protons. Due to the chemical shift these protons have a resonance frequency which is shifted by a predefined frequency shift with respect to the resonance frequency of free water protons. In the process a solution of a minimization problem is determined for each of the transmission coils, in which case a weighted sum is minimized which exhibits at least two of the following three norms: the norm 245 of the deviation of the generated magnetization from an ideal magnetization of the free water protons in each point in space, the norm 255 for the magnetization of the bound protons in each point in space, and the norm 265 for the magnetization of protons whose resonance frequency is shifted by the negative value with respect to the predefined frequency shift.

The RF pulses determined by the processing unit 330 with respect to their shape are for example generated by the transmitting unit 340 and forwarded to the transmission coils 350 in order in this way to excite or saturate the corresponding MR signals in the magnetic resonance system 300.

FIG. 4 shows the time sequence of signals for the inventive CEST imaging. First, one or more saturation pulses 410 are emitted in order to saturate the protons of the CEST substance. Since these protons can be excited with a different frequency due to their chemical shift, it is possible to excite the saturation of these protons independently from the protons of the free water.

In a special embodiment of the present invention each of these saturation pulses 410 is divided into n different sub-pulses 415. In FIG. 4 the division into four sub-pulses is shown as an example. The spatial variation of the Larmor frequency can then for example be taken into consideration directly via the specification of the phase distributions of the sub-pulses. I.e. the phase distributions of the target magnetizations for each sub-pulse develop from sub-pulse to sub-pulse in such a way that they map the phase development of the magnetization due to local variations of the Larmor frequency. With this spatial variations of the Larmor frequency are taken into consideration with the specification of a target phase and the pulse design reduces to a magnetization with unshifted Larmor frequency. Excitation and non-excitation can be optimized simultaneously to different frequencies through suitable selection of the time lag between the sub-pulses.

The saturation pulse is followed by the excitation pulse 420 which is adapted to the free water protons.

As a consequence of the chemical exchange, saturated protons of the CEST substance can exchange places with excited free water protons so that an echo signal 430 can be detected at the site of the CEST substance. The duration of a saturation pulse should in the process be shorter than the longitudinal relaxation time of the free water protons.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic field insensitive chemical exchange saturation transfer (CEST) imaging in magnetic resonance tomography, comprising:
    operating a magnetic resonance data acquisition unit, comprising a plurality of radio-frequency (RF) coils and a basic field magnet that generates a basic magnetic field, by detecting, with said RF coils, magnetic resonance (MR) signals from bound protons of a substance and by emitting at least one RF pulse that saturates said MR signals and at least one RF pulse that excites said MR signals;
    with said RF pulses generated by said RF coils, producing a magnetization in each point in space as a function of a spatial distribution of the basic magnetic field, of a spatial distribution of respective RF fields generated by the RF coils, of a time course of a field gradient that is activated during excitation of said MR signals, a time envelope function of a respective RF pulse, and a predetermined frequency shift; and
    shaping at least one of said RF pulses for saturation of the MR signals for each RF coil as a solution of a minimization problem in a computerized processor in which a weighted sum is minimized, which exhibits at least two norms selected from the group consisting of the norm of the magnetization of free water protons in each point in space, the norm of a deviation of the magnetization of the bound protons from an inverted magnetization in each point in space, and the norm of the magnetization of protons with a shift inverted with respect to the predetermined frequency shift in each point in space.

2. A method as claimed in claim 1 comprising repeatedly emitting an RF pulse for saturation of the MR signals prior to emission of the MR pulse for excitation of the MR signals.

3. A method as claimed in claim 1 comprising selecting said predetermined frequency shift to correspond to a chemical shift of said substance with respect to the resonance frequency of free water protons.

4. A method as claimed in claim 1 comprising determining said spatial distribution of the basic magnetic field and the spatial distribution of the RF field generated by the respective RF coils respectively by recording a $B_0$ map and $B_1$ map.

5. A method as claimed in claim 1 comprising saturating said MR signals at a first frequency and a second frequency, with said first frequency being shifted with respect to the resonance frequency of free water protons by said predetermined frequency shift, and with said second frequency shifted with respect to the resonance frequency of free water protons opposite to said predetermined frequency shift.

6. A method as claimed in claim 1 comprising shaping said at least one RF pulse for excitation of said MR signals by a solution of a minimization problem in which a weighted sum is minimized, which exhibits at least two norms selected from the group consisting of the norm of deviation of the generated magnetization from an ideal magnetization of free water protons in each point in space, the norm for the magnetization of the bound protons in each point in space, and the norm for the magnetization of protons having a resonance frequency that is shifted by a negative value by the predetermined frequency shift.

7. A method as claimed in claim 1 comprising dividing each of said at least one RF pulse for saturation and said at least one RF pulse for excitation into a sequence of a plurality of sub-pulses, and applying each of said sub-pulses at a predetermined time that allows a designated frequency to be assumed in determining the shape of the respective RF pulse.

8. A method as claimed in claim 1 comprising, in a processor, reconstructing an image from said MR signals, and calculating a saturation behavior for the chemical shift for said predetermined frequency shift and for a shift inverted with respect to said predetermined frequency shift, and using said saturation behavior in said processor for correction of a CEST effect in the reconstruction of said image.

9. A magnetic resonance system for magnetic field insensitive chemical exchange saturation transfer (CEST) imaging in magnetic resonance tomography, comprising:
    a magnetic resonance data acquisition unit, comprising a plurality of radio-frequency (RF) coils and a basic field magnet that generates a basic magnetic field;
    a control unit configured to operate said data acquisition unit to detect, with said RF coils, magnetic resonance (MR) signals from bound protons of a substance, by emitting at least one RF pulse that saturates said MR signals and at least one RF pulse that excites said MR signals;
    said control unit being configured to operate said data acquisition unit to produce with said RF pulses generated by said RF coils, a magnetization in each point in space as a function of a spatial distribution of the basic magnetic field, of a spatial distribution of respective RF fields generated by the RF coils, of a time course of a field gradient that is activated during excitation of said MR signals, a time envelope function of a respective RF pulse, and a predetermined frequency shift; and
    said control unit including an RF control unit that is configured to shape at least one of said RF pulses for saturation of the MR signals for each RF coil as a solution of a minimization problem in a computerized processor in which a weighted sum is minimized, which exhibits at least two norms selected from the group consisting of the norm of the magnetization of free water protons in each point in space, the norm of a deviation of the magnetization of the bound protons from an inverted magnetization in each point in space, and the norm of the magnetization of protons with a shift inverted with respect to the predetermined frequency shift in each point in space.

10. A magnetic resonance system as claimed in claim 9 wherein said control unit is configured to operate said data acquisition unit to repeatedly emit an RF pulse for saturation of the MR signals prior to emission of the MR pulse for excitation of the MR signals.

11. A magnetic resonance system as claimed in claim 9 wherein said control unit is configured to operate said data acquisition unit to set said predetermined frequency shift to correspond to a chemical shift of said substance with respect to the resonance frequency of free water protons.

12. A magnetic resonance system as claimed in claim 9 wherein said control unit is configured to operate said data acquisition unit to determine said spatial distribution of the basic magnetic field and the spatial distribution of the RF field generated by the respective RF coils respectively by recording a $B_0$ map and $B_1$ map.

13. A magnetic resonance system as claimed in claim 9 wherein said control unit is configured to operate said data acquisition unit to saturate said MR signals at a first frequency and a second frequency, with said first frequency being shifted with respect to the resonance frequency of free water protons by said predetermined frequency shift, and with said second frequency shifted with respect to the resonance frequency of free water protons opposite to said predetermined frequency shift.

14. A magnetic resonance system as claimed in claim 9 wherein said RF control unit is configured to operate said data acquisition unit to shape said at least one RF pulse for excitation of said MR signals by a solution of a minimization problem in which a weighted sum is minimized, which exhibits at least two norms selected from the group consisting of the norm of deviation of the generated magnetization from an ideal magnetization of free water protons in each point in space, the norm for the magnetization of the bound protons in each point in space, and the norm for the magnetization of protons having a resonance frequency that is shifted by a negative value by the predetermined frequency shift.

15. A magnetic resonance system as claimed in claim 9 wherein said control unit is configured to operate said data acquisition unit to divide each of said at least one RF pulse for saturation and said at least one RF pulse for excitation into a sequence of a plurality of sub-pulses, and apply each of said sub-pulses at a predetermined time that allows a designated frequency to be assumed in determining the shape of the respective RF pulse.

16. A magnetic resonance system as claimed in claim 9 comprising, a processor configured to reconstruct an image from said MR signals and to calculate a saturation behavior for the chemical shift for said predetermined frequency shift and for a shift inverted with respect to said predetermined frequency shift, and to use said saturation behavior for correction of a CEST effect in the reconstruction of said image.

17. A non-transitory, computer-readable data storage medium encoded with programming instructions, said programming instructions, when said data storage medium is loaded into a computerized control and evaluation system of a magnetic resonance system that comprises multiple radio-frequency (RF) coils and basic field magnet that generates a basic magnetic field, causing said computerized control and evaluation system to operate said magnetic resonance system to:

detect, with said RF coils, magnetic resonance (MR) signals from bound protons of a substance and by emitting at least one RF pulse that saturates said MR signals and at least one RF pulse that excites said MR signals;

with said RF pulses generated by said RF coils, produce a magnetization in each point in space as a function of a spatial distribution of the basic magnetic field, of a spatial distribution of respective RF fields generated by the RF coils, of a time course of a field gradient that is activated during excitation of said MR signals, a time envelope function of a respective RF pulse, and a predetermined frequency shift; and shape at least one of said RF pulses for saturation of the MR signals for each RF coil as a solution of a minimization problem in a computerized processor in which a weighted sum is minimized, which exhibits at least two norms selected from the group consisting of the norm of the magnetization of free water protons in each point in space, the norm of a deviation of the magnetization of the bound protons from an inverted magnetization in each point in space, and the norm of the magnetization of protons with a shift inverted with respect to the predetermined frequency shift in each point in space.

* * * * *